United States Patent
Naruse

(10) Patent No.: US 12,062,388 B2
(45) Date of Patent: Aug. 13, 2024

(54) SEMICONDUCTOR STORAGE DEVICE HAVING MAGNETORESISTIVE MEMORIES WITH A DIFFERENT COERCIVE FORCE

(71) Applicant: AISIN CORPORATION, Aichi (JP)

(72) Inventor: Takanobu Naruse, Kariya (JP)

(73) Assignee: AISIN CORPORATION, Aichi (JP)

( * ) Notice: Subject to any disclaimer, the term of this patent is extended or adjusted under 35 U.S.C. 154(b) by 242 days.

(21) Appl. No.: 17/439,623

(22) PCT Filed: Dec. 11, 2019

(86) PCT No.: PCT/JP2019/048379
§ 371 (c)(1),
(2) Date: Sep. 15, 2021

(87) PCT Pub. No.: WO2020/255448
PCT Pub. Date: Dec. 24, 2020

(65) Prior Publication Data
US 2022/0157362 A1    May 19, 2022

(30) Foreign Application Priority Data
Jun. 17, 2019   (JP) ................................ 2019-111966

(51) Int. Cl.
*G11C 11/16* (2006.01)
*G11C 11/56* (2006.01)

(52) U.S. Cl.
CPC ...... *G11C 11/1675* (2013.01); *G11C 11/1673* (2013.01); *G11C 11/5607* (2013.01)

(58) Field of Classification Search
CPC ............ G11C 11/1675; G11C 11/1673; G11C 11/5607; G11C 11/005; G11C 11/16; H10B 99/00; H10B 61/00; H10N 50/10; H01L 27/105
See application file for complete search history.

(56) References Cited

U.S. PATENT DOCUMENTS

| | | | | |
|---|---|---|---|---|
| 7,068,532 | B2* | 6/2006 | Motoyoshi | H10B 61/22 |
| | | | | 365/158 |
| 2005/0063221 | A1* | 3/2005 | Motoyoshi | G11C 11/15 |
| | | | | 365/158 |
| 2010/0244163 | A1* | 9/2010 | Daibou | H10N 50/10 |
| | | | | 257/295 |

(Continued)

FOREIGN PATENT DOCUMENTS

| | | |
|---|---|---|
| JP | 2005-101123 A | 4/2005 |
| JP | 2012-014787 A | 1/2012 |
| JP | 2016-184233 A | 10/2016 |

OTHER PUBLICATIONS

International Search Report for PCT/JP2019/048379 dated Mar. 3, 2020 (PCT/ISA/210).

*Primary Examiner* — Khamdan N. Alrobaie
(74) *Attorney, Agent, or Firm* — Sughrue Mion, PLLC

(57) ABSTRACT

A semiconductor storage device including a first magnetoresistive memory and a second magnetoresistive memory that are two types of magnetoresistive memories accessed by a target logic unit that is one logic unit. The target logic unit Ω the first magnetoresistive memory, and the second magnetoresistive memory are formed on one semiconductor chip, and the first magnetoresistive memory has a larger coercive force than the second magnetoresistive memory.

2 Claims, 2 Drawing Sheets

(56) References Cited

U.S. PATENT DOCUMENTS

| | | |
|---|---|---|
| 2012/0002466 A1 | 1/2012 | Higo et al. |
| 2013/0015539 A1* | 1/2013 | Choi .................. H10N 50/10 |
| | | 257/E29.323 |
| 2018/0024747 A1 | 1/2018 | Naruse |
| 2019/0066746 A1 | 2/2019 | Li et al. |

* cited by examiner

SEMICONDUCTOR STORAGE DEVICE HAVING MAGNETORESISTIVE MEMORIES WITH A DIFFERENT COERCIVE FORCE

CROSS REFERENCE TO RELATED APPLICATIONS

This application is a National Stage of International Application No. PCT/JP2019/048379 filed Dec. 11, 2019, which designates the United States, incorporated herein by reference, and which claims the benefit of priority from Japanese Patent Application No. 2019-111966, filed Jun. 17, 2019, the entire contents of which are incorporated herein by reference.

TECHNICAL FIELD

The present disclosure relates to a semiconductor storage device.

BACKGROUND ART

As an example of a device in which a semiconductor storage device is used, a memory controller that transmits data to a memory via a signal line as described in Japanese Unexamined Patent Application Publication No. 2016-184233 (JP 2016-184233 A) (Patent Document 1) can be mentioned. Hereinafter, the reference numerals shown in parentheses in the description of the background art are those of Patent Document 1. As shown in FIG. 2 of Patent Document 1, this memory controller (C) includes a storage circuit (15) as a semiconductor storage device. As described in paragraphs 0021 and 0022 of Patent Document 1, this memory controller (C) is configured to use the storage circuit (15) as a work memory for storing working data to perform various processing such as replacement processing and restoration processing.

RELATED ART DOCUMENTS

Patent Documents

Patent Document 1: JP 2016-184233 A

SUMMARY OF THE DISCLOSURE

Problem to be Solved by Various Aspects of the Disclosure

Volatile memory has been generally used for semiconductor storage devices (work memory and the like described above) in which data is rewritten relatively frequently, but it has been considered to replace this volatile memory with a magnetoresistive memory (MRAM), which is a kind of a non-volatile memory that can be rewritten. When a magnetoresistive memory is used for semiconductor storage devices in this way, it is conceivable that not only data that is rewritten relatively frequently such as work data but also data that is rewritten infrequently such as setting data (programs, initial setting data, etc.) are stored in the magnetoresistive memory.

However, due to the structure of the magnetoresistive memory, if an attempt is made to secure a large number of data rewritable times, the data retention period becomes short. Thus, when a magnetoresistive memory is configured so that the number of rewritable times can be obtained to an extent that it can be replaced with that of the volatile memory, the retention period of data such as setting data, which is infrequently rewritten, tends to be shortened. As a result, it may be necessary to load the setting data from another storage device at the time of starting the device in which the semiconductor storage device is used, which may increase the start-up time and increase the power consumption due to such processing.

Therefore, it is desired to realize a technique capable of appropriately securing both the number of data rewritable times and the data retention period, when a magnetoresistive memory is used in a semiconductor storage device.

Means for Solving the Problem

A semiconductor storage device according to the present disclosure includes a first magnetoresistive memory and a second magnetoresistive memory that are two types of magnetoresistive memories accessed by a target logic unit that is one logic unit. The target logic unit, the first magnetoresistive memory, and the second magnetoresistive memory are formed on one semiconductor chip. The first magnetoresistive memory has a larger coercive force than the second magnetoresistive memory.

According to this configuration, since the first magnetoresistive memory has a larger coercive force than the second magnetoresistive memory, the coercive force of the second magnetoresistive memory is made relatively small to increase the number of data rewritable times, while the coercive force of the first magnetoresistive memory is made relatively large to secure a long data retention period. That is, by using two types of magnetoresistive memories, it is possible to form, in the semiconductor storage device, two types of memory areas, namely, a memory area formed by the second magnetoresistive memory and having a large number of data rewritable times, and a memory area formed by the first magnetoresistive memory and having a long data retention period. Thus, according to the above configuration, it is possible to realize the semiconductor chip in which the target logic unit can access such two types of memory areas.

As described above, according to the above configuration, it is possible to appropriately secure both the number of data rewritable times and the data retention period, when a magnetoresistive memory is used in the semiconductor storage device.

Further features and advantages of the semiconductor storage device will be clarified from the following description of the embodiments described with reference to the drawings.

DETAILED DESCRIPTION OF EMBODIMENTS

An embodiment of a semiconductor storage device will be described with reference to the drawings. In the present embodiment, a case where the semiconductor storage device is used as a register (register file) will be described as an example.

A semiconductor storage device 20 is a storage device formed on a semiconductor chip 1. Thus, the semiconductor storage device 20 (for example, a memory cell constituting the semiconductor storage device 20 or a rewriting circuit for rewriting data for the memory cell) is formed by using a semiconductor material.

Figure 1:
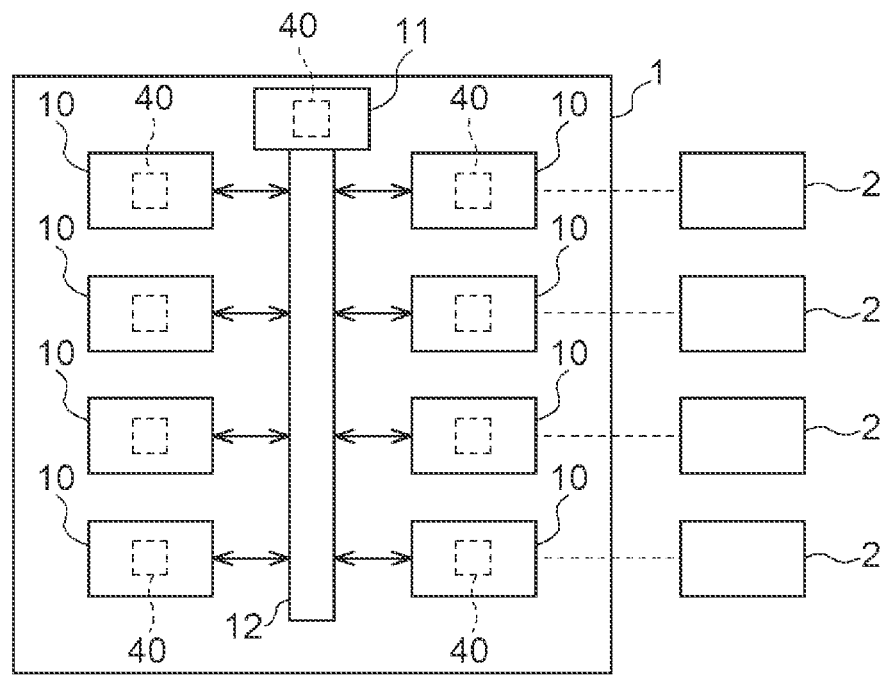
FIG. 1 is a block diagram showing a schematic configuration of an example of a semiconductor chip.

FIG. 1 shows an example of the semiconductor chip 1 on which the semiconductor storage device 20 is formed. The semiconductor chip 1 is, for example, a system on a chip (SoC). The semiconductor chip 1 includes a plurality of circuits (semiconductor integrated circuits) integrated on one chip. The semiconductor chip 1 is formed with a circuit that constitutes a logic unit 40 described later, and a circuit that constitutes the semiconductor storage device 20 (memory unit). A circuit constituting another functional unit (for example, an analog unit) may be formed on the semiconductor chip 1. The plurality of circuits included in the semiconductor chip 1 is formed on a semiconductor substrate (semiconductor die such as a silicon die) incorporated in the semiconductor chip 1. For example, the configuration may be such that the semiconductor chip 1 includes one semiconductor substrate, and all the circuits included in the semiconductor chip 1 are formed on the one semiconductor substrate.

As shown in FIG. 1, the semiconductor chip 1 includes a plurality of functional modules 10 connected to each other by an internal bus 12. Further, the semiconductor chip 1 includes a processor 11 such as a central processing unit (CPU), and the processor 11 is connected to each of the functional modules 10 by the internal bus 12. Each of the functional modules 10 functions as a peripheral logic unit that realizes peripheral functions (support functions and the like) of the processor 11, or functions as an interface unit for exchanging data or signals between the semiconductor chip 1 and an external device 2 (a device provided outside the semiconductor chip 1). The external device 2 is, for example, a storage device, a sensor, or the like provided outside the semiconductor chip 1. In the example shown in FIG. 1, some of the plurality of functional modules 10 are functional modules 10 that exchange data or signals with the external devices 2.

Figure 2:
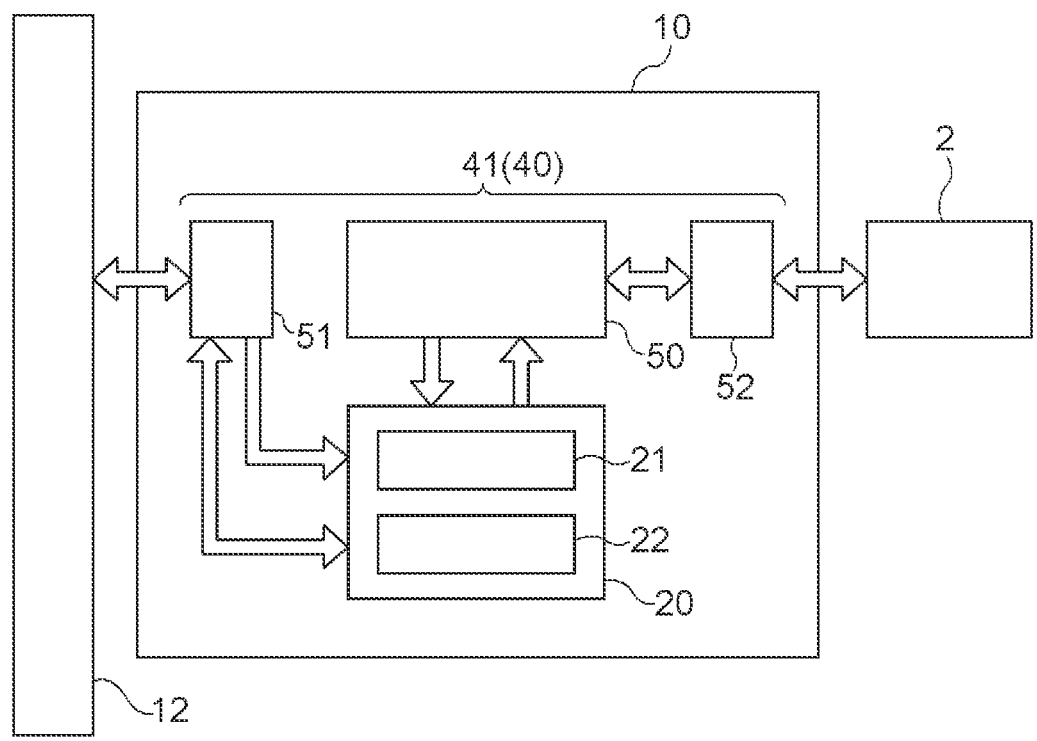
FIG. 2 is a block diagram showing a schematic configuration of an example of a functional module.

Each of the functional modules 10 and the processor 11 includes the logic unit 40. The logic unit 40 includes a logic circuit and performs processing (calculation processing, conversion processing, etc.) using the logic circuit. As shown in FIG. 2, in the present embodiment, the semiconductor storage device 20 is a semiconductor storage device attached to the functional module 10, and is accessed by the logic unit 40 included in the functional module 10. That is, assuming that one logic unit 40 that accesses the semiconductor storage device 20 is a target logic unit 41, in the present embodiment, the target logic unit 41 is the logic unit 40 included in one functional module 10. In the present embodiment, the semiconductor storage device 20 functions as a register of the functional module 10 that includes the target logic unit 41, and the target logic unit 41 (specifically, a calculation circuit 50 described later) operates based on data stored in the semiconductor storage device 20.

FIG. 2 shows an example of the functional module 10 including the target logic unit 41. Hereinafter, the functional modules 10 other than the functional module 10 shown in FIG. 2 will be referred to as other function modules 10. As shown in FIG. 2, the target logic unit 41 includes the calculation circuit 50 and a first circuit 51. The calculation circuit 50 is configured to perform calculation processing according to an operation program. The operation program for operating the calculation circuit 50 is stored in the semiconductor storage device 20 (specifically, a first magnetoresistive memory 21 described later).

The first circuit 51 is connected to the internal bus 12 and the semiconductor storage device 20, and is configured to control data transmission between the semiconductor storage device 20 and the other functional modules 10 or the processor 11 via the internal bus 12. That is, the first circuit 51 is a control circuit that functions as an internal bus control unit. An address bus for designating an address in the semiconductor storage device 20 and a data bus for exchanging data are formed between the first circuit 51 and the semiconductor storage device 20, and the first circuit 51 is configured to read and write data at a designated address.

The functional module 10 shown in FIG. 2 is a functional module that exchanges signals with the external device 2, and the target logic unit 41 includes a second circuit 52. The second circuit 52 is connected to the calculation circuit 50 and is also connected to the external device 2 via an external bus. The second circuit 52 is a control circuit that functions as an external signal control unit. The second circuit 52 is configured to convert data input from the calculation circuit 50 into signals and output the signals to the external device 2, and is also configured to convert signals input from the external device 2 into data and output the data to the calculation circuit 50. It should be noted that the configuration may be such that only one of the output of the signals from the second circuit 52 to the external device 2 and the input of the signals from the external device 2 to the second circuit 52 is performed.

Figure 3:
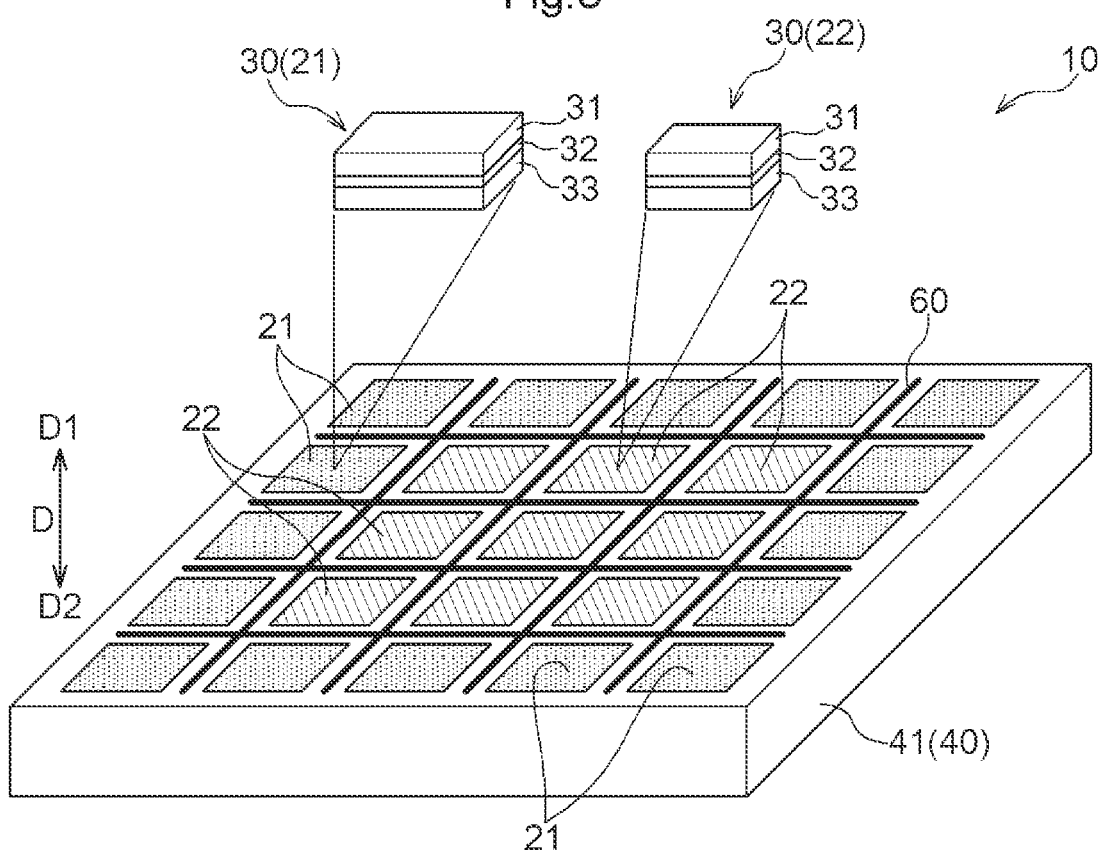
FIG. 3 is a perspective view showing a schematic configuration of an example of a semiconductor storage device.

As shown in FIG. 2, the semiconductor storage device 20 includes a first magnetoresistive memory 21 and a second magnetoresistive memory 22, which are two types of magnetoresistive memories accessed by the target logic unit 41. Magnetoresistive random access memory (MRAM) is a non-volatile memory having a magnetic tunnel junction as a memory cell 30. As schematically shown in FIG. 3, the memory cell 30 (magnetic tunnel junction) constituting the magnetoresistive memory has a structure in which a second layer 32, which is an insulator layer, is sandwiched between a first layer 31 and a third layer 33, which are two ferromagnetic layers. The ferromagnetic layer is formed using, for example, a ferromagnetic semiconductor material.

One of the first layer 31 and the third layer 33 is a fixed layer in which the magnetization is fixed, and the other of the first layer 31 and the third layer 33 is a free layer in which the magnetization is variable. By changing the magnetization direction of the free layer to switch electrical resistance values of the memory cell 30 (magnetic tunnel junction) between high and low values, information of one bit can be stored in the memory cell 30. The memory cells 30 are disposed side by side in an array (two-dimensional array) on a plane orthogonal to the thickness direction D of the semiconductor chip 1. Although details are omitted, a rewriting circuit for rewriting data for the memory cells 30 is configured to select a memory cell 30 to be rewritten using a transistor (cell selection transistor).

Figure 4:
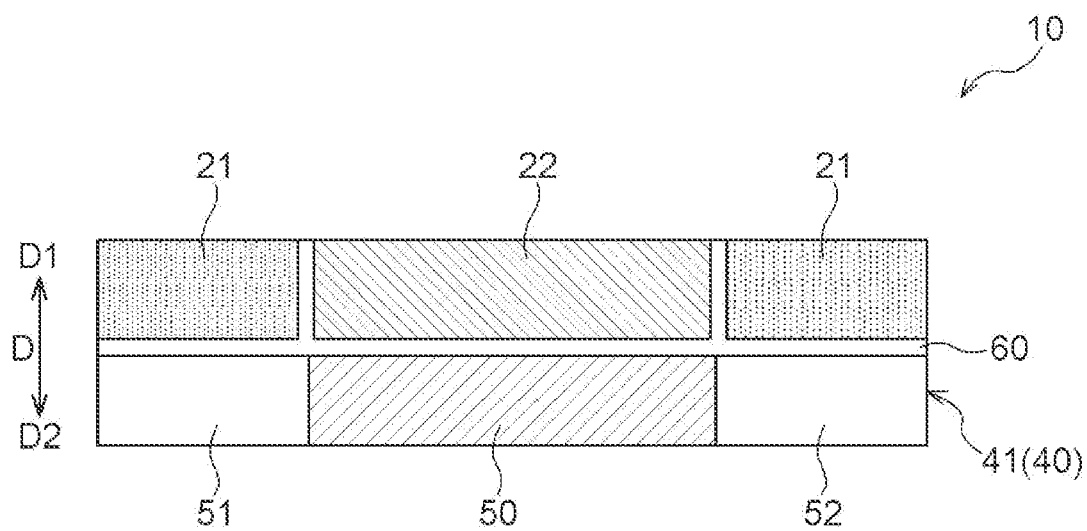
FIG. 4 is a diagram showing an example of a positional relationship between the semiconductor storage device and a target logic unit.

As schematically shown in FIGS. 3 and 4, the target logic unit 41, the first magnetoresistive memory 21, and the second magnetoresistive memory 22 are formed on one semiconductor chip 1. That is, the first magnetoresistive memory 21 and the second magnetoresistive memory 22 are embedded MRAMs. Here, the target logic unit 41, the first magnetoresistive memory 21, and the second magnetoresistive memory 22 are mixedly mounted on the same semiconductor substrate (semiconductor die). Specifically, the first magnetoresistive memory 21 and the second magnetoresistive memory 22 are integrally formed on the front side D1 (surface layer side) with respect to the target logic unit 41. In other words, the target logic unit 41 is formed on the back side D2 (inner layer side) of the semiconductor chip 1 with respect to the first magnetoresistive memory 21 and the second magnetoresistive memory 22. Here, the front side D1 is one side of the thickness direction D (the side where each element is formed with respect to the semiconductor substrate), and the back side D2 is the other side of the thickness direction D (the side opposite to the front side D1).

The first magnetoresistive memory 21 has a larger coercive force than the second magnetoresistive memory 22. Specifically, the coercive force of the memory cell 30 constituting the first magnetoresistive memory 21 (specifically, the coercive force of the free layer) is larger than the coercive force of the memory cell 30 constituting the second magnetoresistive memory 22 (specifically, the coercive force of the free layer). In the present embodiment, the volume of the memory cell 30 constituting the first magnetoresistive memory 21 is made larger than the volume of the memory cell 30 constituting the second magnetoresistive memory 22, so that the coercive force of the memory cell 30 constituting the first magnetoresistive memory 21 is made larger than the coercive force of the memory cell 30 constituting the second magnetoresistive memory 22. The volume of the memory cell 30 can be, for example, the total volume of each of the first layer 31, the second layer 32, and the third layer 33.

An example of a configuration in which the volume of the memory cell 30 constituting the first magnetoresistive memory 21 is larger than the volume of the memory cell 30 constituting the second magnetoresistive memory 22 can be a configuration in which the area of the memory cell 30 constituting the first magnetoresistive memory 21 (the area in the direction viewed along the thickness direction D, the same applies hereinafter) is larger than the area of the memory cell 30 constituting the second magnetoresistive memory 22. In this case, the thickness of the first layer 31, the thickness of the second layer 32, and the thickness of the third layer 33 can be the same between the first magnetoresistive memory 21 and the second magnetoresistive memory 22. Thus, it is possible to suppress the complication of the manufacturing process due to forming two types of magnetoresistive memories on the semiconductor chip 1.

As described above, since the first magnetoresistive memory 21 has a larger coercive force than the second magnetoresistive memory 22, the coercive force of the second magnetoresistive memory 22 is made relatively small to increase the number of data rewritable times, while the coercive force of the first magnetoresistive memory 21 is made relatively large to secure a long data retention period. That is, as a memory area accessible by the target logic unit 41, it is possible to form two types of memory areas on the semiconductor chip 1, namely, a memory area formed by the second magnetoresistive memory 22 and having a large number of data rewritable times, and a memory area formed by the first magnetoresistive memory 21 and having a long data retention period.

Since the first magnetoresistive memory 21 has a long data retention period, it is desirable that the configuration is such that, from the viewpoint of shortening the start time of the device in which the semiconductor chip 1 is used, the data required by the target logic unit 41 when the device is started is stored in the first magnetoresistive memory 21. From this point of view, in the present embodiment, the setting data is configured to be stored in the first magnetoresistive memory 21. The setting data stored in the first magnetoresistive memory 21 includes an operation program of the target logic unit 41 (specifically, the calculation circuit 50). The setting data stored in the first magnetoresistive memory 21 may further include other data. For example, the configuration may be such that the setting data includes initial setting data of the target logic unit 41 (specifically, the calculation circuit 50), or the setting data includes data of constants (control constants and the like) used for the calculation in the target logic unit 41 (specifically, the calculation circuit 50).

In contrast, since the second magnetoresistive memory 22 has a large number of data rewritable times, it is desirable that the configuration is such that the data that is rewritten relatively frequently is stored in the second magnetoresistive memory 22, from the viewpoint of prolonging the life of the semiconductor storage device 20. From this point of view, in the present embodiment, the work data is configured to be stored in the second magnetoresistive memory 22. The work data stored in the second magnetoresistive memory 22 includes the calculation result by the target logic unit 41 (specifically, the calculation circuit 50). The work data stored in the second magnetoresistive memory 22 may further include other data. For example, the configuration may be such that the work data includes input data that is input to the target logic unit 41 (specifically, the calculation circuit 50), or the work data includes output data that is output from the target logic unit 41 (specifically, the calculation circuit 50).

As schematically shown in FIG. 4, in the present embodiment, the second magnetoresistive memory 22 is disposed at a position closer to the calculation circuit 50 than where the first magnetoresistive memory 21 is disposed. In the present embodiment, since the work data is stored in the second magnetoresistive memory 22 as described above, data is exchanged between the second magnetoresistive memory 22 and the calculation circuit 50 more frequently than between the first magnetoresistive memory 21 and the calculation circuit 50. Therefore, by disposing the second magnetoresistive memory 22 in which data is frequently exchanged with the calculation circuit 50 near the calculation circuit 50, the wiring path length between the calculation circuit 50 and the second magnetoresistive memory 22 can be kept short. As a result, the length of a clock tree 60 for supplying the clock signal to each unit is kept short, making it possible to reduce the power consumption.

For example, the configuration in which the second magnetoresistive memory 22 is disposed at a position closer to the calculation circuit 50 than where the first magnetoresistive memory 21 is disposed can be realized by disposing at least a part of the second magnetoresistive memory 22 at a position overlapping the calculation circuit 50 in the direction viewed along the thickness direction D, and disposing at least a part of the first magnetoresistive memory 21 at a position overlapping the first circuit 51 or the second circuit 52 in the above direction.

Other Embodiments

Next, other embodiments of the semiconductor storage device will be described.

(1) In the above embodiment, a case where the semiconductor storage device 20 is used as a register (register file) has been described as an example. However, the configuration is not limited to such a configuration, and the semiconductor storage device 20 may be configured to be used as a storage device other than the register.

For example, the semiconductor storage device 20 can be configured to be used as a cache for the processor 11. In this case, the target logic unit 41 is the logic unit 40 included in the processor 11. The tag (address) of the cached block is stored in the first magnetoresistive memory 21, and the contents of the cached block are stored in the second magnetoresistive memory 22. That is, the first magnetoresistive memory 21 includes a tag array (address array), and the second magnetoresistive memory 22 includes a data array. The processor 11 may be a graphics processing unit (GPU) or the like instead of the CPU.

Further, for example, the semiconductor storage device 20 may be configured to be used as a storage device that is connected to the processor 11 via the internal bus 12. In this case, the target logic unit 41 is the logic unit 40 included in the processor 11. The memory area formed by the first magnetoresistive memory 21 is used as a program area, and the memory area formed by the second magnetoresistive memory 22 is used as a data area.

(2) In the above embodiment, a configuration has been described as an example in which the volume of the memory cell 30 constituting the first magnetoresistive memory 21 is made larger than the volume of the memory cell 30 constituting the second magnetoresistive memory 22, so that the coercive force of the first magnetoresistive memory 21 is made larger than the coercive force of the second magnetoresistive memory 22. However, the configuration is not limited to such a configuration, and at least one of the structure and the material may be made different between the memory cell 30 constituting the first magnetoresistive memory 21 and the memory cell 30 constituting the second magnetoresistive memory 22, so that the coercive force of the first magnetoresistive memory 21 is made larger than the coercive force of the second magnetoresistive memory 22. In this case, unlike the above embodiment, the configuration may be such that the volume of the memory cell 30 constituting the first magnetoresistive memory 21 is equal to or less than the volume of the memory cell 30 constituting the second magnetoresistive memory 22.

(3) In the above embodiment, a configuration has been described as an example in which the second magnetoresistive memory 22 is disposed at a position closer to the calculation circuit 50 than where the first magnetoresistive memory 21 is disposed. However, the configuration is not limited to such a configuration, and for example, the configuration may be such that the first magnetoresistive memory 21 is disposed at a position closer to the calculation circuit 50 than where the second magnetoresistive memory 22 is disposed.

(4) The configurations disclosed in each of the above-described embodiments can be applied in combination with the configurations disclosed in the other embodiments (including combinations of the embodiments described as the other embodiments), as long as there is no contradiction. With respect to other configurations, the embodiments disclosed in this specification are merely exemplary in all respects. Therefore, various modifications can be made as appropriate without departing from the spirit of the present disclosure.

Outline of Embodiment Described Above

Hereinafter, the outline of the semiconductor storage device described above will be described.

A semiconductor storage device (20) includes a first magnetoresistive memory (21) and a second magnetoresistive memory (22) that are two types of magnetoresistive memories accessed by a target logic unit (41) that is one logic unit (40). The target logic unit (41), the first magnetoresistive memory (21), and the second magnetoresistive memory (22) are formed on one semiconductor chip (1), and the first magnetoresistive memory (21) has a larger coercive force than the second magnetoresistive memory (22).

According to this configuration, since the first magnetoresistive memory (21) has a larger coercive force than the second magnetoresistive memory (22), the coercive force of the second magnetoresistive memory (22) is made relatively small to increase the number of data rewritable times, while the coercive force of the first magnetoresistive memory (21) is made relatively large to secure a long data retention period. That is, by using two types of magnetoresistive memories (21, 22), it is possible to form, in the semiconductor storage device (20), two types of memory areas, namely, a memory area formed by the second magnetoresistive memory (22) and having a large number of data rewritable times, and a memory area formed by the first magnetoresistive memory (21) and having a long data retention period. Thus, according to the above configuration, it is possible to realize the semiconductor chip (1) in which the target logic unit (41) can access such two types of memory areas.

As described above, according to the above configuration, it is possible to appropriately secure both the number of data rewritable times and the data retention period, when a magnetoresistive memory is used in the semiconductor storage device (20).

Here, it is preferable that a volume of a memory cell (30) constituting the first magnetoresistive memory (21) be larger than a volume of a memory cell (30) constituting the second magnetoresistive memory (22).

According to this configuration, the coercive force of the first magnetoresistive memory (21) can be made larger than the coercive force of the second magnetoresistive memory (22) by differentiating the volumes of the memory cells (30), while the first magnetoresistive memory (21) and the second magnetoresistive memory (22) share the same structure and material. Therefore, the manufacturing cost of the semiconductor chip (1) can be reduced as compared to the case in which the structure and the material need to be different between the first magnetoresistive memory (21) and the second magnetoresistive memory (22).

Further, it is preferable that the first magnetoresistive memory (21) store setting data including an operation program of the target logic unit (41), and the second magnetoresistive memory (22) store work data including a calculation result by the target logic unit (41).

According to this configuration, the setting data is stored in the first magnetoresistive memory (21) having a long data retention period, so that the need to write the setting data into the first magnetoresistive memory (21) at the time of starting the device in which the semiconductor chip (1) is used can be basically eliminated, which can shorten the start time, and the power consumption required for such a writing process can be reduced. Further, according to the above configuration, the work data that is rewritten relatively frequently is stored in the second magnetoresistive memory (22) having a larger number of data rewritable times, so that the life of the semiconductor storage device (20) can be appropriately secured.

Although the data retention period is shorter than that of the first magnetoresistive memory (21), the second magnetoresistive memory (22) can also retain the data for a certain period of time. Therefore, when the work data is stored in the second magnetoresistive memory (22) at the time of starting the device in which the semiconductor chip (1) is used, the start time can be further shortened by using the work data.

As described above, in the configuration in which the setting data is stored in the first magnetoresistive memory (21) and the work data is stored in the second magnetoresistive memory (22), it is preferable that the target logic unit (41) include a calculation circuit (50) that performs calculation processing in accordance with the operation program, and the second magnetoresistive memory (22) be disposed at a position closer to the calculation circuit (50) than where the first magnetoresistive memory (21) is disposed.

When the setting data is stored in the first magnetoresistive memory (21) and the work data is stored in the second magnetoresistive memory (22), data is exchanged between the second magnetoresistive memory (22) and the calculation circuit (50) more frequently than between the first magnetoresistive memory (21) and the calculation circuit (50). According to the above configuration, by disposing the second magnetoresistive memory (22) in which data is frequently exchanged with the calculation circuit (50) near the calculation circuit (50), the wiring path length between the calculation circuit (50) and the second magnetoresistive memory (22) can be kept short, and the power consumption can be reduced.

The semiconductor storage device according to the present disclosure only needs to be capable of exhibiting at least one of the effects described above.

DESCRIPTION OF THE REFERENCE NUMERALS

1 semiconductor chip
20 semiconductor storage device
21 first magnetoresistive memory
22 second magnetoresistive memory
30 memory cell
40 logic unit
41 target logic unit
50 calculation circuit

The invention claimed is:

1. A semiconductor chip having a storage device comprising:
   a target logic unit, a first magnetoresistive memory and a second magnetoresistive memory that are each a different type of magnetoresistive memory, each accessed by the target logic unit that is one logic unit, wherein:
   the target logic unit, the first magnetoresistive memory, and the second magnetoresistive memory are formed on the semiconductor chip;
   the first magnetoresistive memory and the second magnetoresistive memory are formed on a front side surface of the semiconductor chip with respect to the target logic unit such that the first magnetoresistive memory and the second magnetoresistive memory are stacked on the target logic unit that is disposed on a back side surface of the semiconductor chip;
   the target logic unit includes a calculation circuit that performs calculation processing in accordance with an operation program;
   at least a part of the second magnetoresistive memory is disposed overlapping the calculation circuit of the target logic unit when viewed from the front side to be closer to the calculation circuit than the first magnetoresistive memory; and
   the first magnetoresistive memory has a larger coercive force than the second magnetoresistive memory,
   wherein:
   the first magnetoresistive memory stores setting data including the operation program of the target logic unit;
   the second magnetoresistive memory stores work data including a calculation result by the target logic unit; and
   the second magnetoresistive memory is disposed at a position closer to the calculation circuit than where the first magnetoresistive memory is disposed.

2. The semiconductor storage device according to claim 1, wherein a volume of a memory cell constituting the first magnetoresistive memory is larger than a volume of a memory cell constituting the second magnetoresistive memory.

\* \* \* \* \*